United States Patent
Wu et al.

(10) Patent No.: US 8,848,419 B2
(45) Date of Patent: Sep. 30, 2014

(54) SENSING MEMORY ELEMENT LOGIC STATES FROM BIT LINE DISCHARGE RATE THAT VARIES WITH RESISTANCE

(75) Inventors: Jui-Jen Wu, Zhubei (TW); Meng-Fan Chang, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 239 days.

(21) Appl. No.: 13/570,305

(22) Filed: Aug. 9, 2012

(65) Prior Publication Data

US 2014/0043886 A1 Feb. 13, 2014

(51) Int. Cl.
*G11C 11/00* (2006.01)
(52) U.S. Cl.
USPC ............... 365/148; 365/189.05; 365/230.08
(58) Field of Classification Search
USPC .................. 365/148, 189.05, 230.08
See application file for complete search history.

(56) References Cited

U.S. PATENT DOCUMENTS 5,774,411 A * 6/1998 Hsieh et al. .............. 365/230.06

* cited by examiner

*Primary Examiner* — Son Dinh
*Assistant Examiner* — Nam Nguyen
(74) *Attorney, Agent, or Firm* — Duane Morris LLP

(57) ABSTRACT

A digital memory element has a sense circuit latch to read the value stored in a bit cell. Before addressing a word line, the bit lines are precharged. During the read operation, a bit line is coupled to a supply voltage through a bit cell memory element that has different resistances at logic states "0" and "1." A reference bit line is coupled to the supply voltage through a comparison resistance value, especially a resistance between high and low resistance of the memory element in the two logic states. Voltages on the bit line and reference bit line ramp toward a switching threshold at rates related to the resistance values. The first line to discharge to switching threshold voltage sets the sense circuit latch.

20 Claims, 8 Drawing Sheets

SENSING MEMORY ELEMENT LOGIC STATES FROM BIT LINE DISCHARGE RATE THAT VARIES WITH RESISTANCE

BACKGROUND

This disclosure relates to circuits for discerning the logic value stored in a memory bit cell or other storage element.

The logic value is discerned by whether rates of voltage discharge when commencing a memory read operation are characteristic of a conductive path of higher resistance or lower resistance through the bit line to a supply voltage. The bit line discharges more or less quickly than a reference bit line emulating a resistance value between higher and lower resistance values of the bit cell in its distinct logic states. The rates of discharge are compared by latching the sensing circuit into an output state that represents which of the bit line and the reference line was first to discharge to a threshold voltage. The disclosed techniques are applicable generally to memory and data storage applications characterized by a difference in bit line resistance through a memory element when in different logic states.

According to embodiments of the present disclosure, a precharged bit line can be viewed as a charged capacitance. When a bit cell is addressed for a read operation, the bit cell is coupled along the associated bit line to the power supply and to the sense amplifier. The sense amplifier input represents a load, discharging the bit line through the bit cell resistance coupled back to the power supply. The resistance path has a relatively higher or lower resistance in different logic states of the bit cell. The voltage on the bit line discharges more or less quickly depending on the bit cell logic state.

Typical sense amplifiers compare differences in voltage, for example on complementary bit lines. A sense amplifier latch is enabled at a short time after a read operation commences. If the sense amplifier is enabled after a very short time delay, the voltage divergence of complementary bit lines may be small. In a similar circuit arrangement, a sense amplifier may compare the voltages of a single bit line versus the voltage on a reference bit line (rather than comparing the voltages of complementary lines). Again, if the sense amplifier is enabled after a very short time delay, the divergence between the bit line voltage and the reference bit line voltage may be small.

If the divergence of the voltages being compared is less than the offset of the sense amplifier, the enabled sense amplifier may latch or commence to latch into a logic state that is not the same as the logic state of the bit cell whose logic state is supposed to be copied to the sense amplifier latch. In a situation wherein the bit cell and the sense amplifier each have a latch (such as cross-coupled inverters, for example), the sense amplifier latch and the bit cell latch oppose one another. The output data value from the sense amplifier latch may be erroneous, or the sense amplifier latch may force the bit cell latch to change state, in a so-called read disturb error. Conventionally, the sense amplifier enable signal needs to be delayed until the divergence of the bit line voltages (namely the difference between complementary bit line voltages or the difference between a bit line voltage and a reference voltage) exceeds the worst-case sense amplifier offset for all the bit cells in an addressed memory word. But it is desirable that the time delay be brief so that the memory cycle time for a read operation on the memory can be short and the memory can be clocked at a high frequency.

What is needed is a circuit and technique whereby a sense amplifier can be enabled shortly after the read operation commences, even as soon as a word line address signal becomes true. Advantageously, the sense amplifier should become latched early but dependably into a state representing the logic state of the bit cell being read out. An optimal sensing circuit will not rely on aspects that are potentially ambiguous for a time when the read operation begins, such as a comparison of voltages on a bit line BL and a reference line REFBL. In particular, a fast sensing circuit is needed that does not require voltage divergence exceeding an offset voltage of a comparator used as a sense amplifier when reading out the logic state of a bit cell that has been enabled for reading (e.g., addressed). Circuits and techniques are needed that read bit cell logic values dependably without unnecessary delay.

SUMMARY

An object of this disclosure is to provide a sense amplifier arrangement that does not rely on a comparison between two voltages on complementary bit lines, particularly a voltage comparison made at a critical delay time into a read cycle. During a read cycle, a bit cell is coupled by a bit line to an input of a sense amplifier that compares the discharging voltage on the bit line to a threshold, while also comparing the discharging voltage on a reference bit line to a threshold, for example a same voltage threshold. The rate at which the voltages discharge is the aspect that is used to distinguish the logic state of the bit cell.

Therefore, an integrated circuit memory has a sense circuit latch to read the value stored in an addressed bit cell. Before addressing a word line, the bit lines are precharged. During the read operation, a bit line is coupled to a supply voltage through a bit cell memory element that has different resistances at logic states "0" and "1." A reference bit line is coupled to the supply voltage through a comparison resistance value, especially a resistance between high and low resistance of the memory element in the two logic states. Voltages on the bit line and reference bit line ramp toward a switching threshold at rates related to the resistance values, and the first to reach the switching threshold sets the sense circuit latch. By distinguishing by the rates of voltage discharge to the threshold, the sense circuit detects the logic value of the bit cell without the need to compare two voltages, and without requiring a precisely timed sense amplifier enabling signal.

The rate of voltage discharge is a function of the discharge current and is affected by the bit cell logic state, in particular whether the bit cell presents a high or low resistance. A high resistance memory cell bit line discharges more slowly than a low resistance memory cell bit line. The first of the bit lines to cross the threshold determines the logic level by determining whether the bit line or the reference bit line has a lower resistance, thereby determining the logic level of the bit cell without the need to compare diverging voltages to one another. The reference bit line can be a supplemental bit line that is provided only to produce a discharging voltage that emulates a resistance value falling between the resistance values of the bit cell in its high resistance and low resistance states. In that event, it is not necessary to use complementary bit lines because the high or low resistance states of a single bit line (or the resistance states of either of two complementary bit lines BL or BLB, if available) can be compared to the reference bit line. Thus, the sensing circuit and technique are applicable to embodiments with register or memory bit cells of a sort that have only has one bit line, such as an MRAM element with a single magnetic tunnel junction element. The sensing circuit is also applicable to bit cells with complementary outputs.

For this purpose, a sense circuit for an integrated circuit memory has a sense latch with two inverters for reading out the value of an addressed bit cell. Prior to reading, a precharge signal charges at least one of the bit lines coupled to the bit cell and a reference current source is established. The reference current source couples a resistance between the bit cell power supply and one of the sense circuit inputs. The resistance is less than the high resistance value for the bit cell and/or greater than the low resistance value of the bit cell. Blocking transistors normally disable the inverters of the sense circuit latch. During the read operation, the at least one bit cell node coupled to the sense circuit input sinks current at a different current amplitude compared to the reference current source. The bit line input and the reference bit line input present voltages that ramp downwardly, at different rates, toward a switching threshold. The first bit line to reach the switching threshold voltage turns on the blocking transistor of an inverter in the sense circuit, which unblocks the inverter while forcing the inverter output low and setting the other inverter output high. The sense circuit latch thereby is loaded without the need to provide a timed sense-amplifier enable signal and without the need to compare complementary bit line voltages against one another after a critical delay.

BRIEF DESCRIPTION OF THE DRAWINGS

The foregoing and other objects and aspects will be appreciated by the following discussion of preferred embodiments and examples, with reference to the accompanying drawings, and wherein.

DETAILED DESCRIPTION OF EXEMPLARY EMBODIMENTS

Figure 1:
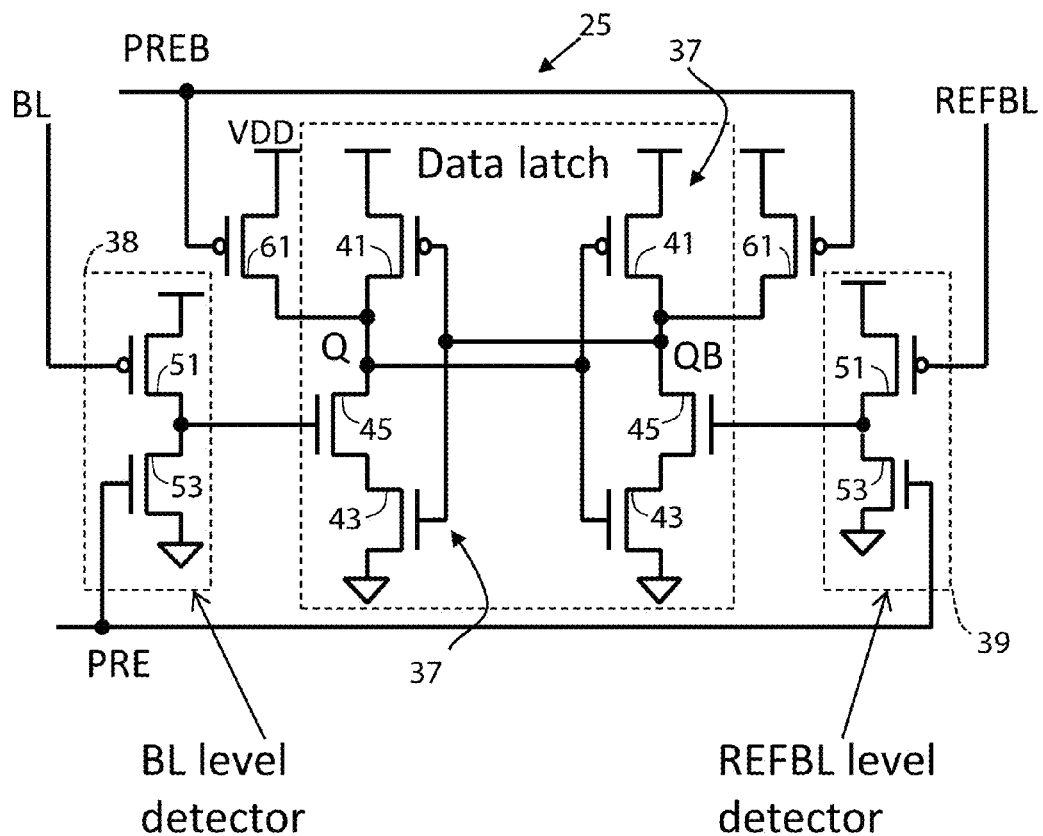
FIG. 1 is a schematic showing an embodiment of a sense circuit wherein a sense amplifier latch is responsive to two comparators configured to set or reset the sense amplifier latch based on which of a bit line BL, and a reference current bit line REFBL first crosses a comparison reference value.

Circuits and techniques disclosed herein are useful for reading out the stored data value in a bit cell that has a higher or lower resistance in two possible logic states "0" and "1." The bit cell can be integrated with other bit cells into a memory array in which the bit cells correspond to bit positions in addressable memory words.

A digital memory element forming a bit cell has two different logic states. The memory element resides in a circuit that causes junctions or nodes associated with the bit cell to assume different voltages. Engineers often equate VDD and ground voltages ("logic levels") with data values. However memory elements and their circuits also differ as to resistance values and current amplitudes in different logic states. The logic or data values "0" and "1" are distinguished by a relatively higher resistance state that may also be described as a relatively lower current amplitude state at one logic value, versus a lower resistance state and higher current amplitude at the other logic value. The differences in cell resistance, current amplitude and voltage occur on the bit line used to address the bit cell. A nonlimiting list of examples of memory structures that can be embodied with bit cells having distinct resistances in their respective logic states include EEPROM, flash, MRAM, DRAM, SRAM and the like.

When reading out the logic value of a bit cell, one technique is to compare voltage levels. For example, a selected bit line that is discharged through a selected memory cell produces a different voltage in its different logic states. The voltage on a bit line BL that is discharged through a memory cell can be compared with the voltage on a similarly configured reference bit line REFBL discharged through a reference cell. Or the voltage on the bit line BL might be compared to another reference voltage produced as a threshold for comparison.

In some memory structures, individual memory elements hold the logic value of a bit cell in a parameter associated with differing resistances, and there is a single bit line BL per bit cell. The parameter is obtained from BL for comparison with a reference bit line REFBL. Other memory structures, such as SRAMs have complementary devices that store logic values, such as two cross coupled CMOS inverters whose output nodes are coupled to the bit line BL and the bit line complement BLB ("bit-line-bar"). In bit cells with complementary bit lines BL and BLB, the two complementary bit lines may be compared against one another to discern two logic states. The bit line complement BLB is used as the reference bit line REFBL.

In this disclosure, it can be assumed that REFBL refers generally to reference bit lines in any of such memory structures. Complementary applications such as SRAM are simply a special case wherein the BL and REFBL lines can be connected to the complementary BL/BLB lines of the memory cell. Even in complementary applications, it is not mandatory that BLB be used as the reference bit line REFBL for making a comparison. As described hereinafter, there are advantages if REFBL represents an intermediate or average resistance between the resistances of complementary elements.

It is an aspect of the present disclosure that instead of comparing voltages associated with BL and REFBL lines at a critical point in time during a read operation, resistance values and current amplitudes produce distinctly different rates of discharge in different logic states. The rates of discharge are the basis for discriminating the logic value stored in a bit cell. As disclosed herein, there are advantages to discriminating the logic levels using the rates of discharge instead of the voltage levels.

A comparison that discriminates for logic level by discharge rate is accomplished in one embodiment by establishing which of the bit lines BL or REFBL is first to discharge from a precharge voltage to a threshold voltage. The precharge voltages can be equal and the switching threshold voltages are equal. A voltage discharge race determines which of the compared bit lines, BL versus REFBL discharges more quickly than the other. The rate of discharge is related to the resistance along the bit line through the bit cell to the supply voltage. If bit line BL crosses the threshold first, the bit cell defines a path to the power supply with a low resistance state, characteristic of one possible logic state. If the comparison bit line REFBL is first to cross the threshold (or if BLB crosses first in an embodiment comparing complementary bit lines), then the bit cell is in the other logic state.

This technique of racing to the voltage threshold works whether REFBL is an independent reference bit line or is the complementary BLB. But if REFBL is an independent reference instead of BLB, and the resistance of REFBL is chosen to fall between values of BL in the two logic states (or between BL and BLB), a decision as to the logic state can be made by the time that REFBL discharges to the comparison threshold even if BL is in its high resistance state and reaches the threshold later. According to embodiments described herein, the decision is made when the line with the lower resistance reaches the threshold first.

The logic state of a bit cell is to be loaded into a sense circuit 25 having a sense amplifier latch comprising cross-coupled inverters 37 and two level detectors 38, 39, shown in FIG. 1. The circuit is primed by precharge voltage levels on complementary precharge lines PRE and PREB before a read operation. Signal PRE is high (true or precharging) and PREB is low (false) when no word line address signal is active. In the precharging state, sense circuit 25 is in an unlatched ambiguous state wherein both nodes Q and QB are at high voltage VDD.

During the memory read operation, a word line address signal couples a bit cell to the sense circuit 25. Concurrently with the word line address signal, precharge signal PRE goes low (false, or not precharging) and signal PREB goes high. The state of the data latch is then determined by which of the bit lines BL or REFBL is first to cross the switching threshold of the transistor 51 in the corresponding one of level detectors 38 or 39. The switching threshold is about a fifth of the power supply voltage applied to the level detectors 38, 39, which can be VDD.

The bit cells of the memory array (not shown in FIG. 1) are arranged as bits of memory words that are addressable by word lines to select all the memory bits in an addressed word simultaneously when the corresponding word line is addressed. Thus a circuit as in FIG. 1 is provided for each bit position in the addressed memory word. When a bit cell is addressed by a word line signal, the bit line becomes coupled to the power supply through an element in the addressed bit cell, which is either in a relatively more conductive low resistance state or a relatively nonconductive high resistance state, depending on the logic value stored in the bit cell. In the case of an SRAM bit cell, the element can be a switching transistor. In the case of an MRAM bit cell, the element can be a magnetic tunnel junction element. The technique can be applied to various elements, provided that the respective logic states are associated with different cell resistances. The sense circuit determines from the results of the voltage discharging race of BL and REFBL to the switching threshold, whether the bit cell or other memory element is in a high resistance or low resistance state. The logic state of the addressed bit cell is transferred into the sense circuit latch. It is not necessary to compare two voltages that are diverging, or to delay for a critically controlled time before enabling the sense circuit.

FIG. 1 is a schematic diagram showing a sense circuit for reading logic data values from a bit cell (not shown) by discriminating for whether the falling voltage on a bit line BL passes a switching threshold determined by BL level detector circuit 38 before a falling voltage on a reference input REFBL crosses the switching threshold determined by REFBL level detector 39, which is characteristic of a data value "1" stored coupled to a source of a comparison reference current.

In the illustrated embodiment, reading a value out of an addressed bit cell is accomplished using a sense circuit 25 that as shown schematically in FIG. 1 has a sense output latch formed by two cross coupled inverters 37. A sense circuit 25 is provided for each bit position (i.e., for each bit line BL). The nodes of the inverters 37 of the sense circuit 25 are coupled by two comparators 38 to the respective bit line BL, and to a reference source REFBL.

The bit line BL and reference bit line REFBL that are coupled as inputs to the comparators 38 discharge current through the comparators 38, causing the voltages on the bit lines BL, REFBL to decrease or ramp down from initial voltage values. The initial voltages can be the voltages that resulted from pre-charging the bit line BL and reference bit line REFBL while the word lines were not enabled. During the precharge time, the bit line BL (and the complementary bit line BLB if available) was isolated from the bit cells by passing gate transistors.

The bit line voltages ramp down toward a switching threshold voltage established by the BL and REFBL level detectors 38, 39. The rate of discharge of the bit lines BL, REFBL is determined by the current amplitude sinked through the BL and REFBL level detectors 38, 39. The level detectors 38, 39 are substantially identical, and the current amplitude is determined by the resistance of the bit cell, coupled between the supply voltage VDD and the input to the BL and REFBL level detectors.

The level detectors 38, 39 function as voltage comparators with a switching voltage threshold that is less than the supply voltage VDD, for example one fifth of that voltage. One of the level detectors 38, 39 of the sense circuit 25 switches before the other. This sets a logic state into the cross coupled inverters 37 of the sense circuit latch 25. At that point, the output values at the nodes Q, QB become complementary (rather than both high) and represent the logic state read from the bit cell at the addressed word line and the associated bit position.

As explained in more detail below, the switching of the first of the two level detectors 38, 39 to pass the threshold is arranged to disable response to the second of the level connectors to pass the threshold. Thus, the comparator on the second of the bit lines to pass the threshold cannot change the state of the sensing circuit latch defined by cross coupled inverters 37. The decoupling of the later switching comparator can be accomplished by switching a gating transistor provided in series with a PMOS and NMOS transistor forming the inverter 37.

An advantage of this technique is that the value of the sense circuit latch is determined without the need to enable a sense amplifier or similar sense circuit during a particular time window associated with cyclic operation of the memory. Instead, the sense circuit 25 is enabled when the word line signal is applied to address the bit cells in a word, and the bit line precharge voltage bias is switched off.

In FIG. 1, two cross coupled inverters 37 form a sense circuit latch for temporarily holding the logic value read out from an addressed bit cell. Two level detectors 38, 39 are provided, each coupled to one of the inverters 37. The sense circuit 25 is enabled and disabled by switching transistors 53 and 61, and also by two blocking transistors 45, coupled to complementary precharge signals PRE and PREB. The sense circuit 25 operates in such a way that the cross coupling of the inverters 37 is blocked when transistors 45 are nonconductive. Both nodes Q, QB remain at the same logic value (high voltage VDD) in a primed state of the sense circuit 25, until one of the inputs BL or REFBL falls below a switching threshold and sets the sense circuit latch. The circuit does not require a carefully timed sense amplifier enable signal because the circuit responds to the rate of discharge of the input lines BL, REFBL. At least one of the input lines BL has a resistance to the power supply that varies with the logic level stored in the bit cell. If that resistance is lower than a bit cell resistance corresponding to REFBL, then the bit cell is in a "1" logic state. If REFBL switches first, then BL was in a high resistance state (logic "0"). These logic states are discerned by which of the discharging voltages on line BL and on line REFBL wins the race to the switching threshold of level detectors 38, 39.

The first of the two bit lines to switch its associated transistor 51 on to conduct also turns on the associated transistor 45, causing the node Q or QB on that side to go to low voltage (ground) and driving the other complementary node to high voltage (VDD). The sense circuit is thus latched to the value of the bit cell that is being read out, which occurs dependably because the bit cell logic value causes the bit line BL to discharge at a rate that varies with its logic state. Also, in the two different logic states, the resistance along line BL is less than or greater than the resistance of line REFBL. The inverter 37 that is was unblocked by a conductive transistor 45 operates as a normal inverter. The other inverter 37 is held to a complementary output value by the unblocked inverter. When the slower of bit line BL and REFBL later crosses the switching threshold and its transistor 45 becomes conductive, the two inverters 37 operate in the normal manner of a cross coupled inverter latch and reinforce one another to retain the data value in the sense circuit latch.

In the illustrated embodiment, each inverter 37 comprises a PMOS transistor 41 and an NMOS transistor 43 in series with one another and coupled between the VDD power supply and ground. Two nodes Q and QB define the connected inputs and outputs of the two inverters 37. The sense circuit 25 as shown is bilaterally symmetrical, having the same functional switching elements on the both the bit line side BL and the reference side REFBL. A basic function of the sense circuit is to establish a logic state wherein output nodes Q, QB are at complementary logic states (VDD and ground) and the logic state assumed is the same logic state as that of the bit cell 22 (see FIG. 1) that is addressed by a word line signal WL during a read operation.

In FIG. 1, each of the inverters 37 of the sense circuit 25 includes a switching transistor 45 in addition to the PMOS transistor 41 and the NMOS transistor 43 that are elements of a simple CMOS inverter. The switching transistor functions as a switchable blocking element of its respective inverter 37. When transistor 45 is conductive, its associated inverter 37 acts the a normal way of a CMOS inverter, namely assuming one of two voltages at node Q or QB depending on whether PMOS transistor 41 is conductive while NMOS transistor 43 is not conductive, or vice versa. This produces a high voltage VDD at the node Q or QB, or brings the node Q or QB to ground potential, and if both inverters 37 are operational, drives the nodes Q, QB to different voltages VDD or ground.

Cross coupled inverters are normally arranged with each inverter's input coupled to the output of the other inverter, the effect being that the inverters reinforce and hold one another stable in one of two possible logic states. In FIG. 1, the output nodes Q and QB of each inverter 37 are coupled to the connected gates of PMOS and NMOS transistors 41, 43 of the other inverter 37. However, the switching transistor 45 is provided between the nodes (Q or QB) and the NMOS transistor 43 of each inverter, and when transistor 45 is not conductive, the cross coupled inverters are blocked from operating as a latch. According to an aspect of this embodiment, both inverters assume a same logic state in a primed or ready condition of the sense circuit 25, with a high voltage level at both Q and QB.

In the primed or ready condition, the sense circuit 25 can be switched into operation as a latch assuming one of two logic states depending on which of the transistors 45 first begins to conduct. The transistors 45 are switched into a conductive state when the voltage on the associated bit line BL or reference line REFBL falls below a threshold switching voltage of a sense input transistor 51, thereby applying a high voltage to the gate of transistor 45 and causing the transistor 45 to conduct, enabling transistors 41, 43 to act as an inverter. Assuming that bit line BL passes below the threshold, transistors 51 and 45 are made conductive. Node Q goes to ground voltage while node QB is still at high voltage. At the Q node side, transistor 41 is off and transistors 43, 45 are on.

On the other side at node QB, transistor 43 is off and transistor 41 is on. At a later point in time, when the voltage at REFBL passes below the threshold, transistor 45 at node QB becomes conductive. However that does not reset the state of the latch in the sense circuit 25 because the state of the latch was set when the first of the two transistors 45 became conductive. The latch remains set at the logic value previously determined by which of BL and REFBL was first to cross the switching threshold of level detectors 38, 39, until in a new memory cycle, the precharge signals PRE, PREB become active instead of the word line address signal.

Accordingly, a sense circuit 25 is coupled to the bit line BL and reference bit line REFBL. It is possible to compare either of complementary bit lines BL, BLB (if available) against a reference resistance emulation line REFBL, or to compare BL and BLB against one another. Complementary bit lines BL, BLB are necessarily at different logic states, so one of them will always be in a lower resistance state.

Figure 5:
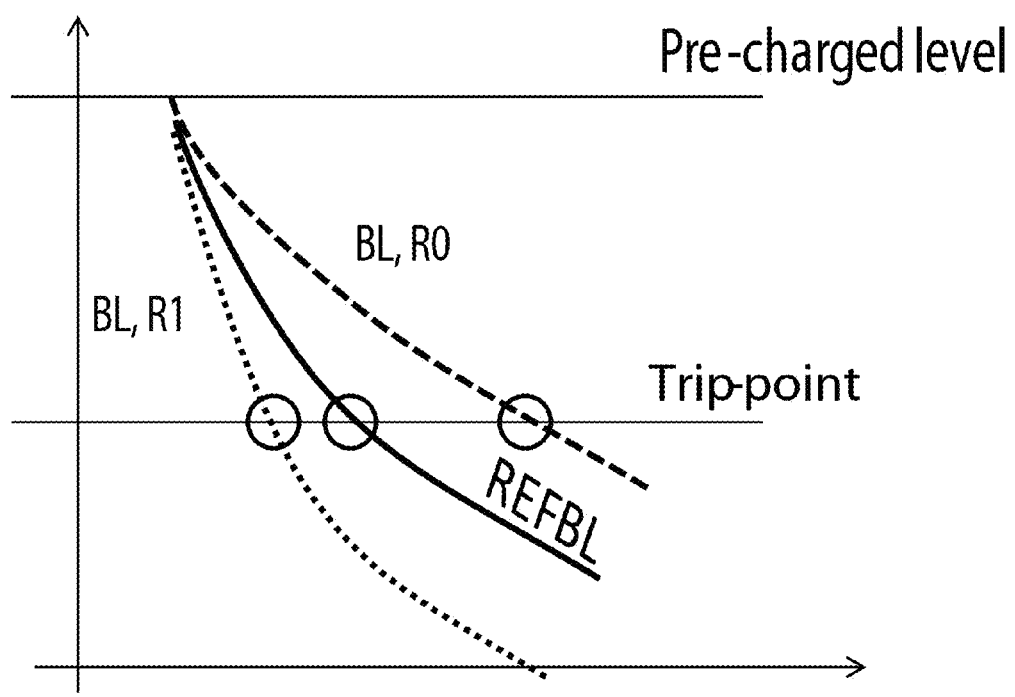
FIG. 5 is a timing diagram showing the voltage over time on a bit line in a logic state "0" with a high resistance R0, the same bit line in a logic state "1" with high resistance R1 (shown to discharge more slowly) and a discharging voltage BLREF characteristic of a resistance between R) and R1.

If a memory bit cell has only one line BL and is in a high or low resistance state, or if only one of two available complementary bit lines BL, BLB is to used, the voltage discharging race is between the bit line and REFBL. Input REFBL to the sense circuit can be provided by a simulated bit line that is characterized by a resistance to ground that is greater than the characteristic low resistance of the bit cell and less than the characteristic high resistance. As shown in the time graph of FIG. 5, illustrating the different voltage-time characteristic of lines that are discharged through different serial resistances, using a simulated bit line REFBL ensures regardless of the logic level stored in the bit cell, that the switching threshold will be crossed and the value of the bit cell read into the sense circuit latch no later than the point at which the voltage on REFBL crosses the threshold.

The voltages on the sense inputs, BL and REFBL advantageously are precharged initially to equal voltages at a time immediately before a word line is addressed. In an SRAM embodiment, for example, the precharge signals are turned off when a word line signal addresses a memory word. The active word line signal couples the bit cells of the memory word to respective bit lines by switching on passing gate transistors to conduct for all the bit cells of the addressed memory word. In an arrangement with complementary bit lines BL, BLB, a precharge or bias arrangement can be provided to charge both bit lines BL, BLB when a precharge timing signal PRE is active. The precharge timing signal can have complementary components PRE and PREB. In the circuit shown in FIG. 1, the complementary precharge signals PRE and PREB provide the signals needed to commence a signal race to determine which of the input lines BL and REFBL will be first to latch the sensing circuit latch. Signal PRE is high during a phase of operation when the word line addressing signals all are false. The PRE level when true can be VDD or a level less than VDD used as the precharge voltage to which bit lines BL, BLB are brought so as to float when not active.

The first level detector 38, 39 to cross the switching threshold sets the state of the sense circuit latch 25, because turning on blocking transistor 45 enables the associated inverter 37 to operate. The blocking transistor 45 on the other inverter 37, which may switch a later time, has prevented said other inverter from affecting the first inverter. When the second level detector to cross the switching threshold switches, and its blocking transistor 45 becomes conductive, the state of the sense circuit latch has already been determined. The two inverters 37 latch up and operate normally as cross coupled inverters due to conduction of transistors 45. In this way, the switching transistors 45 coupled to the inverters 37 enable a first of the comparators 38 or 39 to reach the switching threshold to set the sending circuit latch 25, and disable a second of the comparators to reach the threshold from resetting the latch.

In the embodiment shown in FIG. 1, the complementary precharge voltages PRE and PREB are applied to the sensing circuit 25 in a manner that primes the inverters 37 of the sensing circuit latch in preparation for triggering by the first input BL or REFBL to pass the switching threshold and set the complementary states of output nodes Q, QB. The precharge signal is the inverse of a word line enable signal and the precharge signal is on when any word line is asserted and off when during a phase of memory read operation when no word line is asserted. When a word line signal is asserted, PRE is at low voltage and PREB is at high voltage. In that condition, transistors 53 and 61 are off (nonconductive) When in the precharge mode, PRE is high and PREB is low, such that transistors 53, 61 conduct. Conducting transistors 61 couple a high voltage to both nodes Q, QB. Conducting transistors 53 turn off the blocking transistors 45. Shortly after entering the read phase and asserting a word line signal (PRE being switched to low and PREB to high), current is sinked from the precharged bit lines by the addressed bit cell, and the race to the threshold determines which of the sense circuit nodes is set or reset as a function of the logic state of the addressed bit cell.

Figure 2:
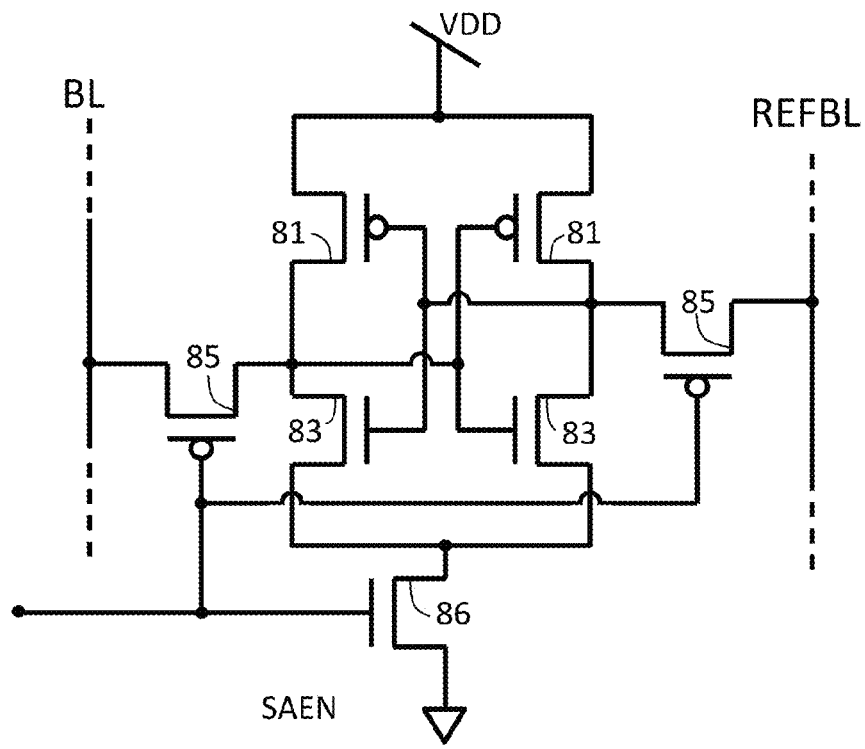
FIG. 2, labeled as prior art, is a schematic example of a conventional sense amplifier latch, which is coupled to the complementary bit lines BL, REFBL by passing gate transistors operated from a sense amplifier enable signal.
Figure 3A:
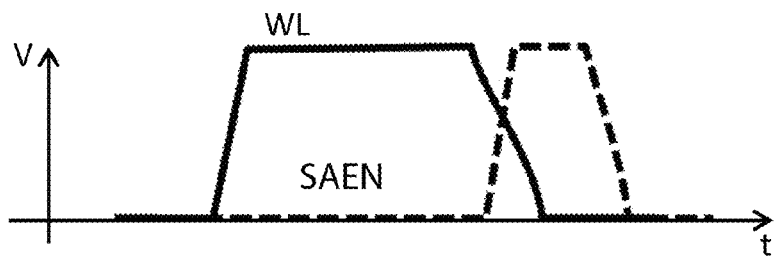
FIGS. 3a, 3b are timing diagrams showing typical timing of a word line address signal and a sense amplifier enable signal and the associated voltages occurring on complementary bit lines BL, BLB.
Figure 3B:
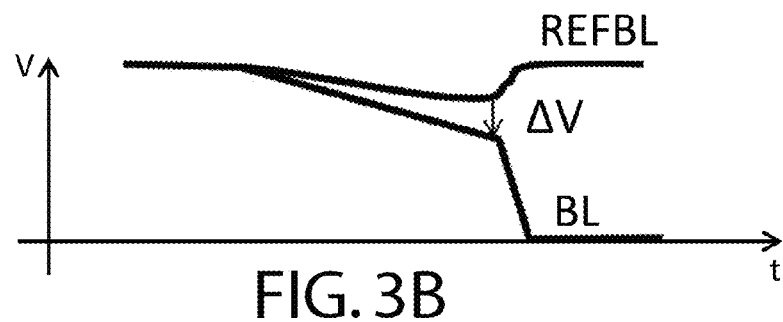

The foregoing circuit differs from conventional sense amplifier latch circuits in that the parameter determining the state of the sense circuit latch is the relative speed at which the bit lines discharge to the switching threshold, which is a function of serial resistance along lines BL or REFBL, and not a comparison based on which voltage is lower. FIG. 2, labeled as prior art, shows a conventional sense amplifier, that is a differential voltage comparator enabled by a timed enable signal. FIGS. 3a, 3b are timing diagrams showing respective voltages during a memory read operation. In this arrangement, a sense amplifier latch is defined by two cross coupled inverters that each comprises series coupled PMOS and NMOS transistors 81, 83. A sense amplifier enable signal SAEN is applied during the word line addressing signal as a low true input to couple the nodes of the sense amplifier latch to complementary bit lines BL, BLB, both being required. The intent is to establish a voltage difference at the nodes of the sense amplifier latch, causing the sense amplifier to latch up in a state that matches the variable logic states of the inverters of the addressed bit cell. The sense amplifier enable signal then changes to high and sense amplifier enable transistor 86 is turned on to apply power (VDD and ground) across the sense amplifier latch. Provided that the difference ΔV between the voltages at BL, BLB exceeds any offset between the cross coupled inverters of the sense amplifier at the time that the sense amplifier enable signal SAEN becomes true, the sense amplifier latch powers up in the same logic state as the bit cell. The powering up of the sense amplifier latch forces the bit lines to VDD and ground (in one order or the other, depending on logic state).

In conventional arrangements as shown in FIGS. 2, 3a, 3b, the timing of the rising edge of the sense amplifier enable signal is critical. If the edge is early, the difference ΔV between the bit line voltages BL, BLB may not yet exceed the offset of the cross coupled inverters. If the rising edge of SAEN is later than necessary, the memory is operated at a lower frequency than it is capable of achieving.

Referring to FIG. 5, a bit cell latch coupled to precharged bit lines BL, BLB sinks a different current amplitude in its "0" or "1" logic states. In the example of an SRAM, the bit cell may have cross coupled inverters 27 that each comprise a PMOS transistor and an NMOS transistor defining a bit cell latch. In one logic state, the PMOS transistor conducts from VDD to the node and the NMOS transistor is off. In another logic state, the NMOS transistor conducts from the node to ground and the PMOS transistor is off. Thus, depending on the logic state of the bit cell, the resistance of a path from VDD to the bit line BL or BLB differs with logic state. In the example of an MRAM, a magnetic junction element may be caused to assume different resistance states by write current bias the sets up higher or lower resistance magnetic field alignments.

Figure 4:
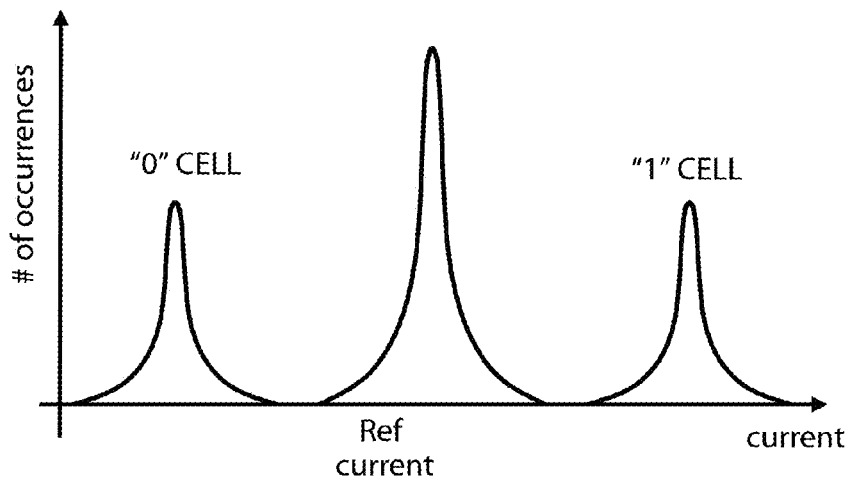
FIG. 4 is a histogram showing populations of current amplitude levels found in discharging bit lines at different logic levels and as compared to a precharge reference current discharge amplitude.

The resistance states of a population of bit cells in a memory has some variation in resistance in the high and low resistance states. Generally, however, the values in the two states are different enough to be distinguishable. FIG. 4 is a histogram showing that the reference currents that can be drawn when switching a load onto a bit line BL fall into different populations. An alternative current source can be provided, such as an additional conductor for each bit line, coupled to the PREB voltage signal by a predetermined serial resistance to be used as a reference, that is between the resistances in the populations of the two logic states. The reference current source for a given bit line also has a distribution as shown in FIG. 4, but is a fixed resistance between the resistances characteristic of a bit line logic state being read out, R0 or R1. FIG. 5 shows that as a result of the current differences resulting from different cell and reference resistances, the ramping down of the voltage on the bit line BL or REFBL proceeds at a different rate. Advantageously, it is not necessary to delay until such time as the higher resistance signal ramps down to the trip point threshold. The logic state of the bit cell is discriminated by whether the ramp-down of the bit line BL or the REFBL line crosses the threshold first. Regardless of the logic state of the bit cell, the decision can be made at least by the time that the voltage at REFBL hits the trip point threshold.

Figure 6:
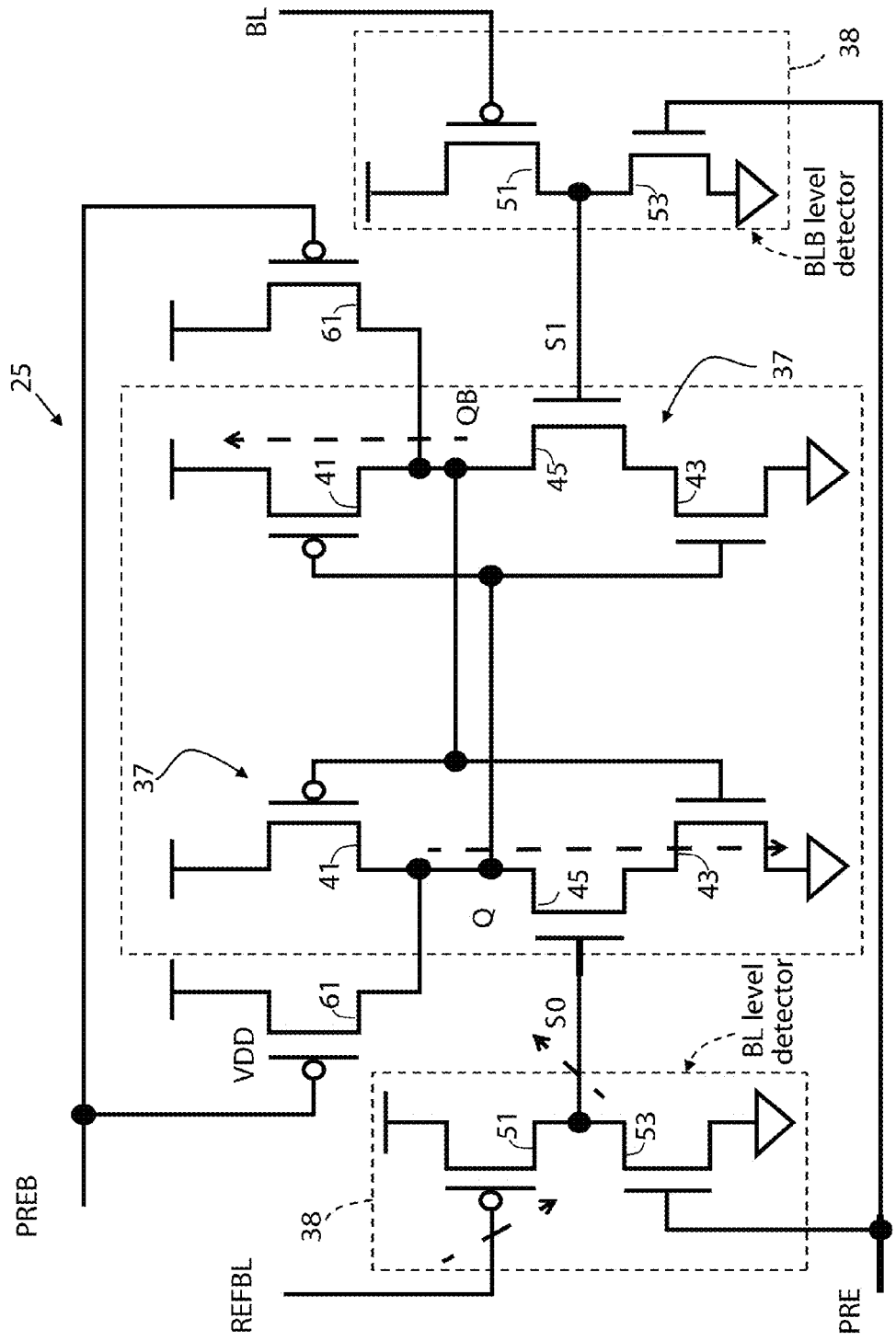
FIG. 6 is a schematic with broken line arrows indicating voltage changes over time with a discharging bit line BL crossing a threshold before a discharging reference line REFBL.

FIG. 6 further demonstrates operation of the sense circuit according to FIG. 1. Prior to entering a word line addressing phase of operation, i.e., during precharge, the precharge signal PRE is high and its complement PREB is low. Thus transistors 61 couple both nodes Q and QB to VDD. Transistors 53 are on, turning blocking transistor 45 off and preventing the otherwise cross coupled inverters 37 from operating as such. Both nodes Q and QB are high.

When any word line address signal becomes active, the precharge status goes off. Signal PRE goes low, turning off transistors 53. The precharged bit line BL is at high voltage, and transistors 51 and 45 are off. Likewise PREB, Q and QB are at high voltage, turning off transistors 41, 61. The only transistors that might conduct are transistors 43 but they are in series with transistors that are not conducting.

In the word line address mode, an addressed bit cell is coupled to the bit line BL, and the precharge of bit line BL discharges. Simultaneously, a reference current source applies a resistance whereby a voltage at REFBL discharges. One of bit line BL and comparison current source line REFBL discharges faster than the other due to the logic state of the bit cell. The voltage on one of the bit lines BL or BLB is first to pass below the switching threshold of its associated transistor 51. The broken line arrows in FIG. 6, show the voltage changes when bit line REFBL falls below the switching threshold of associated transistor 51. Transistor 51 switches to conduct, driving up the voltage at the gate of NMOS blocking transistor 45. Transistor 45 also switches on to conduct, which is possible through the NMOS transistor 43 of the associated inverter 37, which is on because the opposite node QB was initially high. This brings the voltage at node Q to a low voltage. The sense circuit latch then nominally operates as cross coupled inverters except that the blocking transistor 45 on the QB node remains off.

Figure 7:
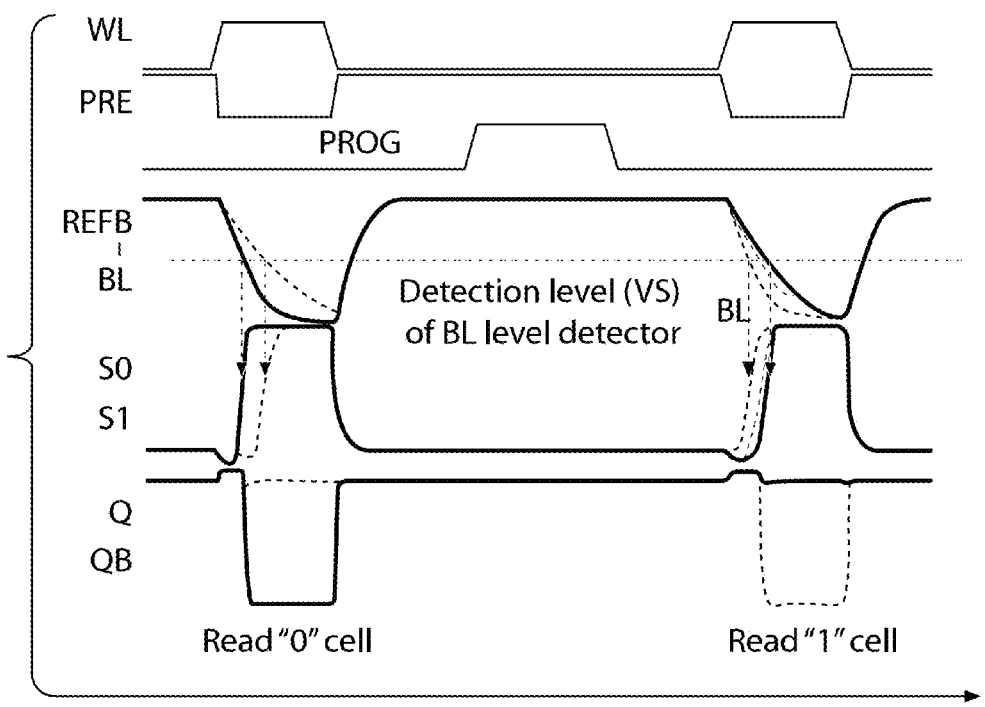
FIG. 7 is a timing diagram showing the word line address, precharge and bit line voltages versus time. The solid and broken lines in FIG. 7 represent logic states 0 and 1, respectively.

FIG. 7 contains corresponding timing plots. In FIG. 7, the word line read addressing enable signal WL (substantially concurrent with the address to any word line) and the precharge signal PRE are mutually exclusive in time. When reading a logical 1 from the addressed bit cell (i.e., at low resistance), BL reaches the threshold before REFBL. When reading a logical 0 (i.e., at high resistance), REFBL reaches the threshold first. FIG. 7 demonstrates the WL, PRE, BL, BLB and Q/QB signals, with the read "0" signals shown in solid liens and the read "1" signals shown in dashed lines.

Figure 8:
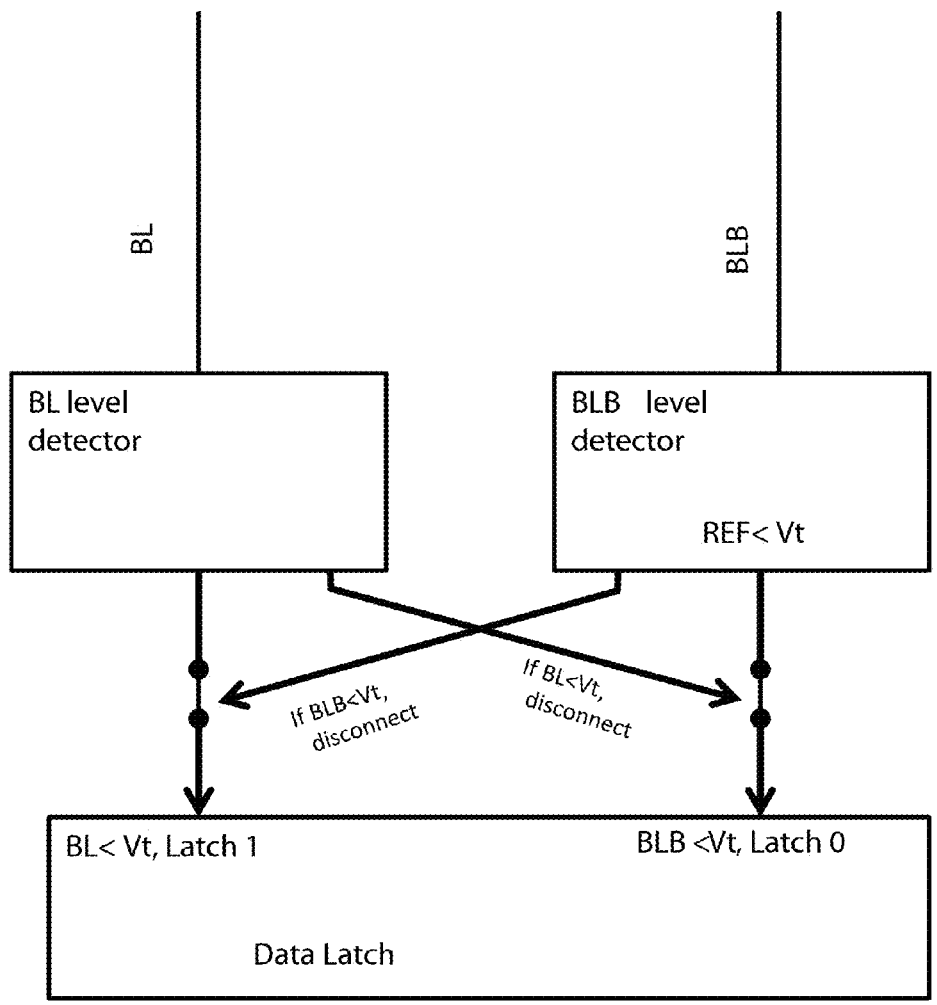
FIG. 8 is a combined block diagram and functional flow chart used in explaining the present subject matter.

FIG. 8 shows the operational relationship of the sense circuit and the associated level detectors for bit lines BL and BLB (namely when using a race between complementary bit lines BL, BLB to a threshold instead of BL versus a supplemental current source REFBL. In general, the data latch is primed in a disabled state because the precharge signals PRE, PREB set the blocking transistors 45 in a nonconducting state prior to assertion of a word line address signal. When a word line address signal is asserted, the precharge signals become inactive in the sensing circuit. The sensing circuit waits for one of the level detectors 38 to determine that the initially precharged voltage on one of the bit lines BL, BLB has fallen below a comparison threshold that is characteristic of PMOS transistor 51. In one of the level detectors 38, transistors 51 reaches its trip point and triggers before the other, due to the difference in discharge rates of bit cell nodes in respective high or low voltage logic states. The tripping transistor activates its associated inverter 37 by turning transistor 45 on to conduct. This forces the output node of that inverter to ground and the output node of the other inverter to VDD, and effectively blocks any output from the opposite level detector 38.

Accordingly, and with general reference to the drawing figures, an integrated circuit memory is provided with a plurality of bit cells occupying bit positions in addressable memory words, each bit cell having at least one node at which a power supply voltage is coupled to a bit line for reading out the bit value of a corresponding bit position of an addressed memory word during a read operation. The coupling has two different resistance values, namely different serial resistances along the bit lines depending on the logic level stored in the bit cell. In some embodiments, such as CMOS SRAM devices, the difference in resistance can be due to the state of switching transistors coupled between the power supply VDD and the bit line BL. In other embodiments, the difference in resistance can be obtained from variable resistance elements such as magnetic tunnel junctions.

A sense circuit 25 is coupled to the bit line BL and to a comparison reference bit line REFBL, at each of the bit positions. The sense circuit has a settable-resettable latch including cross coupled inverters 37 with output nodes Q, QB that can assume complementary voltages defining either of two logic states. The latch of the sense circuit is responsive to two comparators 38 each have a comparator output coupled to one of the nodes Q, QB of the sense circuit latch at a bit line BL. The comparators have a reference input from a source REFBL, and a sense input coupled to one of the complementary bit lines Q or QB at the bit position. When commencing a read operation, the bit cell nodes are coupled to the lines BL, REFBL, and the voltages on the lines ramp downwardly toward a switching threshold trip point of comparators 38, 39. One of the comparators reaches its switching threshold before the other, due to the different current sink amplitudes caused be different serial resistances along lines BL, REFBL.

The first comparator 38, 39 to switch sets an output value into the settable-resettable latch formed by cross coupled inverters 37. In this way, the sense circuit latch 37/37 is set without the need for a timed sense enable signal. It is not necessary to compare the voltages on complementary bit lines BL, BLB against one another. The sense circuit 25 is configured such that a first of the two comparators to reach the trip point switching threshold disables changing of the output value of the settable-resettable latch by the second of the two comparators to reach the switching threshold.

The latch of the sense circuit 25 comprises cross coupled inverters 37 having complementary PMOS and NMOS transistors 41, 43. However, a blocking transistor 45 is coupled into each of the inverters 37. The blocking transistor in these examples is nonconductive in a primed state wherein output nodes Q, QB of the cross coupled inverters are maintained in a same logic state, namely at VDD. In addition to setting the output node Q or QB low when the bit line voltage falls below the threshold, the blocking transistor 45 is switched on to conduct in response to a level detector sensing a bit line voltage below a threshold. In the examples shown, the blocking transistor 45 comprises an NMOS transistor coupled between the output node Q or QB and the NMOS transistor 43 of the complementary PMOS and NMOS transistors forming an inverter 37.

The techniques employed provide a novel method in addition to a novel apparatus. The disclosed method senses a logic value stored in a bit cell with at least one output bit line BL and optionally two complementary bit lines BL, BLB. The bit cell is addressable by a word line signal WL for coupling a voltage level to the output bit line or lines. In preparation for reading out the logic value, the bit line(s) are precharged to a precharge voltage level. Contemporaneously with assertion of the word line signal, the voltage on the bit line is compared to a switching threshold by a voltage level detector 38 while discharging from the precharged level through the serial resistance of the bit cell and bit line. Also contemporaneously with the word line signal a reference bit line REFBL is compared to the switching threshold by a second voltage level detector 39, and discharged.

A complementary bit line BLB can be used as the reference bit line. Preferably however, and also for use in memories in which bit cells have only one bit line, the reference bit line REFBL comprises a conductor that resembles the bit line BL but discharges through a serial resistance that is fixed at a resistance that falls between resistances of the bit cell and bit line BL in the high resistance (logic 1) and low resistance (logic 0) states. The first of the discharging lines BL and REFBL to cross the trip point threshold of the voltage level detectors sets a sense circuit latch 37/37 to one of two logic levels when one of the two bit lines passes the switching threshold, the bit cell value is read out without the need for any carefully timed sense amplifier enable signal.

Setting the sense circuit latch 37/37 comprises establishing an output level at one of two cross coupled inverters of the sense latch circuit Q or QB, thereby forcing a complementary output level on the output of the second of the two inverters. During the time between the first of the inverters to switch on, versus the point at which the voltage on the bit line for the second inverter crosses its switching threshold, the second of the two inverters is disabled because its blocking transistor 45 is not conductive. However the correct values are provided on the output Q, QB as held by the first of the inverters to cross the threshold.

In the disclosed embodiments, wherein the sense circuit comprises two cross coupled inverters 37, each having a PMOS 41 and an NMOS 43 transistor coupled between power supply voltages VDD and ground. An output node Q or QB is defined between the PMOS and NMOS transistors of each inverter 37, and their gates are coupled together and to the output node of the other inverter 37. A blocking transistor 45 between the node and one of the PMOS and NMOS transistors disables a change of state of the second of the two inverters by holding the blocking transistor of the second of the two inverters in a nonconductive state.

In the disclosed embodiments, the sense circuit is enabled by signals associated with a precharge circuit. Complementary precharge signals PRE, PREB are coupled to establish a primed state of the sensing circuit latch prior to addressing of the bit cell. For this purpose, the latch of the sense circuit comprises cross coupled inverters 37 having complementary PMOS and NMOS transistors 41, 43, and a blocking transistor 45 coupled into each of the inverters. The blocking transistor is nonconductive in a primed state and as a result, the output nodes of the cross coupled inverters 37 are maintained in a same logic state when primed, namely VDD in the illustrated examples. The blocking transistor 45 is switched on to conduct in response to a level detector 38 sensing a bit line voltage below a threshold. The blocking transistor of each respective inverter 37 in the examples comprises an NMOS transistor 45 coupled between the output node Q or QB and the NMOS transistor 43 of the inverter 37.

The comparators each comprise a PMOS transistor having a gate coupled to one of the bit lines, a conducting or switch-on threshold voltage of the PMOS transistor providing said switching threshold. As shown for example in FIG. 1, an NMOS transistor is coupled in series with the PMOS transistor 51 having its gate coupled to the one of the bit lines. The NMOS transistor 53 in series with the PMOS transistor 51 has a gate coupled to a precharge signal PRE, enabling a respective one of the comparators 38 when not in a precharge state. Each of the inverters also has a PMOS shunt transistor 61 coupled in parallel with the PMOS transistor 41 of its respective inverter 37. A gate of the PMOS shunt transistor 61 is coupled to a precharge signal PREB for shunting the PMOS transistor of the inverter such during a priming state, prior to assertion of a word line signal, the nodes of the cross coupled inverters are held in a same logic state, VDD.

Figure 9:
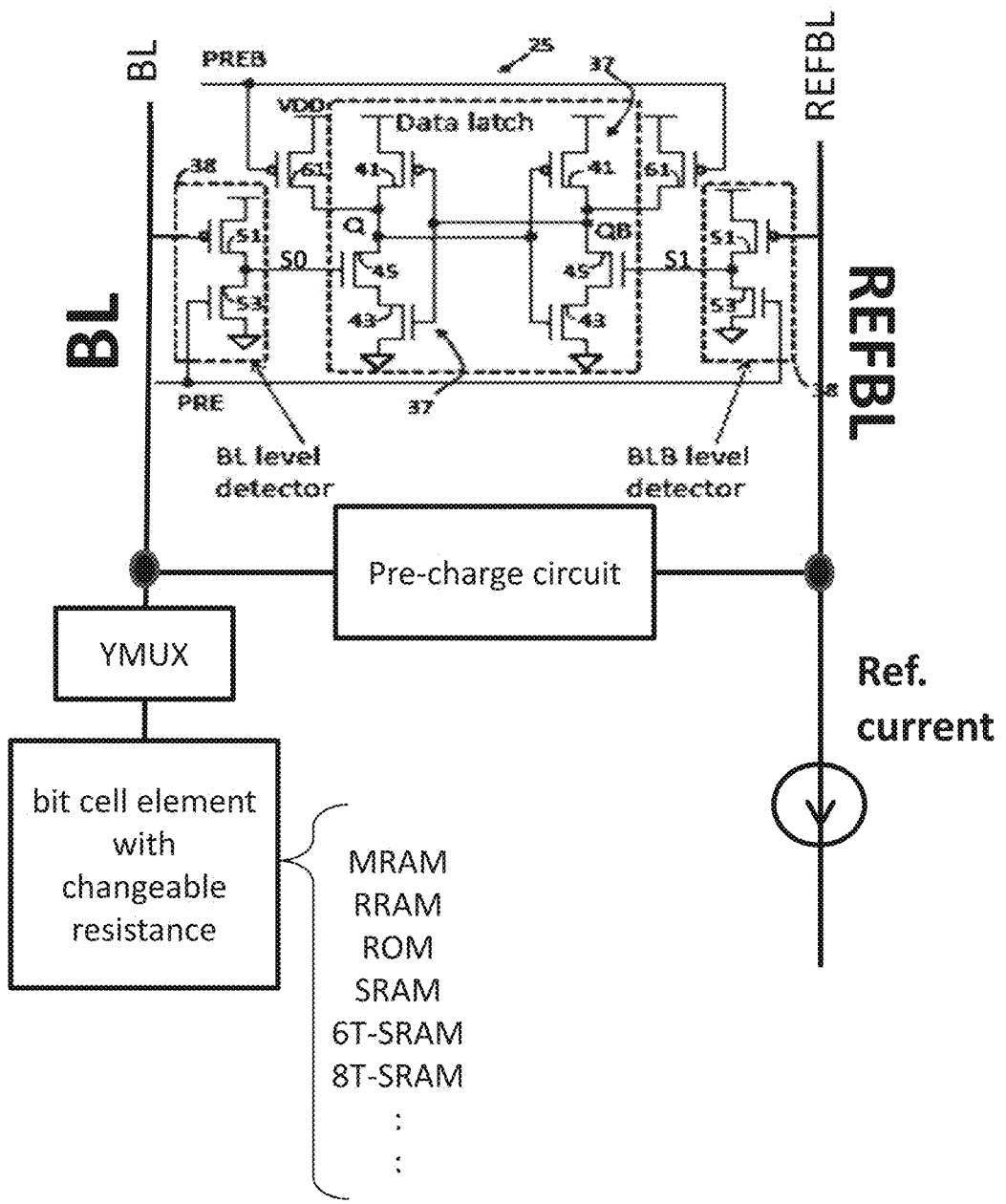
FIG. 9 illustrates a sense circuit as described herein, coupled to a bit cell with changeable resistance, in a memory configuration with bit line precharging.
Figure 10:
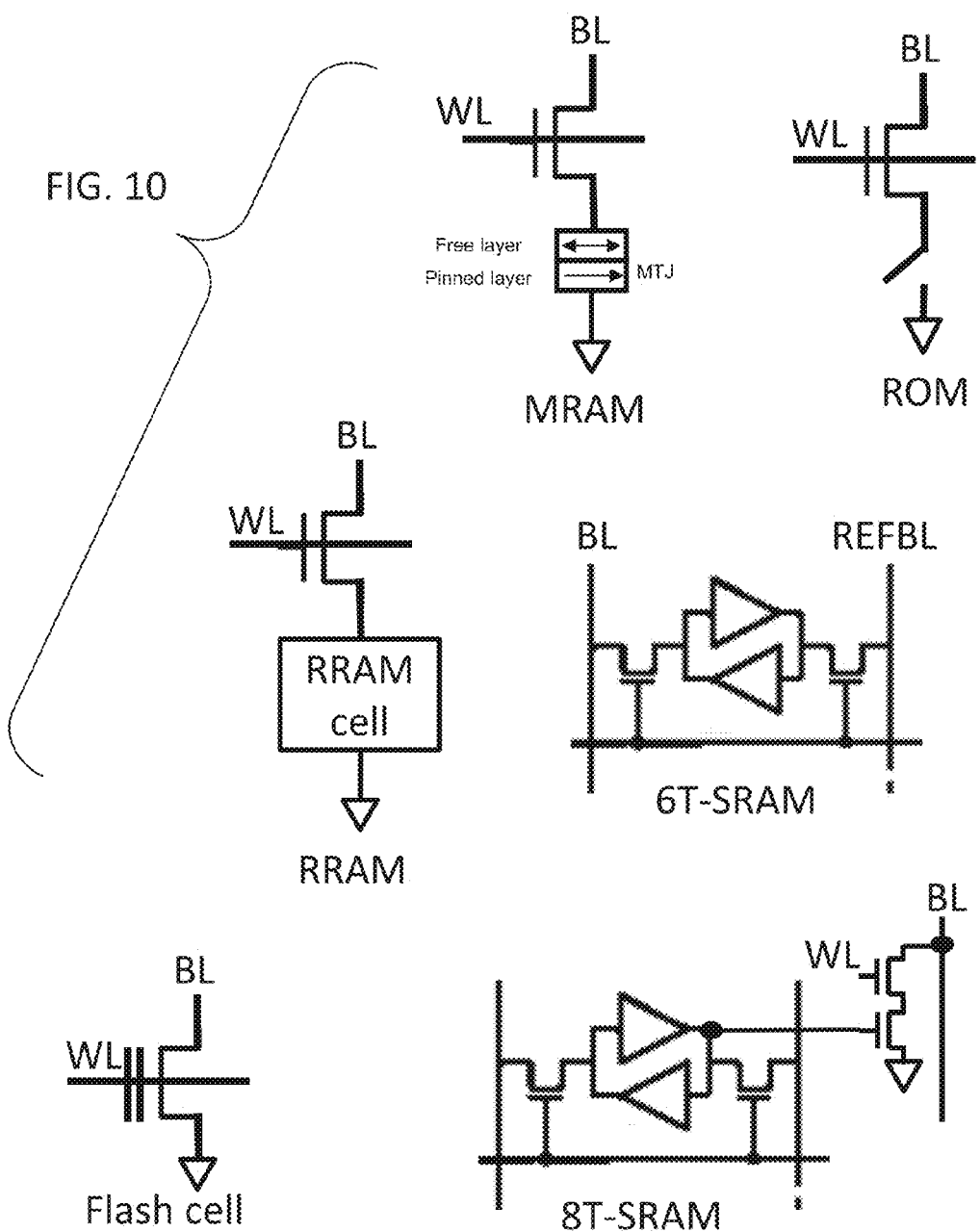
FIG. 10 is a nonlimiting set of several examples of bit cells with changeable resistance.

In FIG. 9, a sense circuit as described is shown coupled to a bit cell with changeable resistance, in a memory configuration with bit line precharging. As shown in FIG. 9, there are a variety of memory types in which the bit cells have different states characterized by different resistances, different current states and/or voltage states above and below some threshold. FIG. 10 shows some examples of bit cells that have different resistances in different logic states, leading to different current and voltage conditions.

A memory bit cell has two states representing logic levels. When residing in a given logic state or when being written to a given logic state, relatively higher and lower levels of resistance and associated current amplitudes and/or voltage higher or lower than a threshold are applied or maintained. As a result, read operations for various types of memory cell are the possible according to the disclosed techniques.

Referring to FIG. 9, the bit line BL and REFBL are precharged to high level. Upon commencing the read operation, BL and REFBL are caused to discharge, the rate of discharge being affected by the logic level. The respective discharge rates are compared, which in the exemplary embodiment is accomplished by allowing the voltages on BL and REFBL to race one another to a switching threshold. The first to reach the threshold triggers a latch representing the logic state that has been read from the memory cell.

FIG. 10 shows simplified schematics for a number of types of memory cells that are characterized by a difference in discharge rate at different logic states, and can be used as described. Thus, the logic states of MRAM, RRAM, ROM, Flash, SRAM, and other memory elements that are similarly characterized by different resistances, can be read out as described, including using a reference current from REFBL that is produced by a complementary bit line if desired, or using a reference current generated in other ways, to represent a comparison threshold falling between that of the memory cell in its two different logic states.

The subject matter has been disclosed and discussed in connection with exemplary embodiments. It should be understood that the invention is not limited to the arrangements disclosed as examples. Reference should be made to the appended claims rather than the disclosed examples, to determine the scope of the invention in which exclusive rights are claimed.

What is claimed is:

1. An integrated circuit memory, comprising:
    a bit cell storing a logical bit value in a state of a memory element that has a changeable resistance, the memory element being coupled to a bit line at least when the bit cell is addressed during a read operation;
    a sense circuit coupled to the bit line for reading the logical bit value from the bit cell during the read operation, wherein addressing the bit cell couples said changeable resistance of the memory element onto the bit line;
    wherein the sense circuit comprises a sense circuit latch, and two level detectors that are switchable for controlling a logic state of the sense circuit latch;
    wherein one of the level detectors of the sense circuit is coupled to the bit line and another of the level detectors is coupled to a reference bit line providing a resistance that is greater and less than the changeable resistance and a changeable current amplitude when the bit cell is storing different said logical bit values;

wherein level coupled to the level detectors by the respective bit line and reference bit line ramp to a switching threshold of the level detectors at rates that differ with the changeable resistance of the memory element of the bit cell; and, wherein the logic state of the sense circuit latch is set by the first of the bit line and the reference bit line to meet the switching threshold.

2. The integrated circuit memory of claim 1, wherein the memory comprises a plurality of bit cells in a memory array, the changeable resistance being defined by a memory element that is relatively conductive and nonconductive according to the logical bit value and is coupled between the bit line and a power supply voltage when the bit cell is addressed.

3. The integrated circuit memory of claim 1, wherein the memory elements of the bit cells have changeable resistance representing a logic state, the memory elements being coupled between the bit line and a power supply voltage when the bit cell is addressed.

4. The integrated circuit memory of claim 1, wherein the sense circuit comprises cross coupled inverters each having a blocking transistor responsive to one of the level detectors, and is configured such that a first level detector to reach the switching threshold switches one of the blocking transistors so as to enable one of the cross coupled inverters and thereby to set the sense circuit latch.

5. The integrated circuit memory of claim 1, wherein the bit line is precharged to a precharge voltage and the memory element is coupled to the bit line when addressed by a word line signal, thereby causing a voltage on the bit line to ramp down from the precharge voltage to the switching threshold.

6. The integrated circuit memory of claim 4, wherein the bit line is precharged to a precharge voltage and the memory element is coupled to the bit line when addressed by a word line signal, thereby causing a voltage on the bit line to ramp down from the precharge voltage to the switching threshold, and wherein precharge enable signals hold the sense circuit latch in an unlatched condition until one of the bit line and the reference bit line reach the switching threshold.

7. The integrated circuit memory of claim 1, wherein the reference bit line is coupled to a predetermined resistance that falls between higher or lower resistances of the memory element of the bit cell when the logical bit value is a zero or one, respectively.

8. The integrated circuit memory of claim 1, wherein the reference bit line is coupled to a complementary memory element associated with the bit cell such that the resistances coupled to the bit line and the reference bit line have complementary high and low resistance states.

9. A method for sensing a logic value stored in a bit cell having a memory element capable of representing different stored logic states in different resistance values, and wherein the memory element is switchably coupled in series with a bit line when the bit cell is addressed for a memory read operation, and wherein the bit line is coupled to a sense circuit latch, the method comprising:

addressing the bit cell and coupling the bit line in parallel with a voltage supply, in series with the memory element, and to a first input of the sense circuit latch, wherein the bit line is coupled to the sense circuit latch through a first level detector having a switching threshold;

providing a reference bit line in parallel with a supplied voltage, in series with a predetermined resistance that is greater and less than the resistance value of the memory element in the different logic states, and coupling the reference bit line to a complementary second input of the sense circuit latch, wherein the reference bit line is coupled to the sense circuit latch through a second level detector having a switching threshold;

applying voltages to the addressed bit cell and to the reference bit line such that voltages applied to the first and second level detectors through the bit line and the reference bit line ramp to the switching thresholds thereof at a rate determined in part by the resistance of the memory element along the bit line and the predetermined resistance along the reference bit line; and, setting an output value of the sense circuit latch according to which of the bit line and the reference bit line is first to meet the respective switching threshold.

10. The method of claim 9, further comprising applying precharge signals during a precharge state when no bit line is addressed, so as to precharge the bit line and the reference bit line to precharge voltage levels prior to addressing the bit cell by assertion of a word line signal to couple the bit cell to the bit line; and, wherein the voltages applied to the first and second level detectors through the bit line and the reference bit line ramp from the precharge voltage to the switching thresholds that are substantially equal.

11. The method of claim 10, wherein the sense circuit latch comprises two inverters, and further comprising disabling the inverters during the precharge state using a blocking transistor in each of the inverters, and to enable cross coupling when setting the output value of the sense circuit latch according to which of the bit line and the reference bit line is first to meet the respective switching threshold.

12. The method of claim 10, wherein the sense circuit comprises two cross coupled inverters, each having a PMOS and an NMOS transistor coupled between power supply voltages, an output node between the PMOS and NMOS transistors, and further comprising a blocking transistor coupled between the node and one of the PMOS and NMOS transistors, wherein said disabling of the change of state of the second of the two inverters comprises holding the blocking transistor of the second of the two inverters in a nonconductive state.

13. The method of claim 9, wherein the predetermined resistance is established by providing a fixed resistance in series with the reference bit line.

14. The method of claim 9, wherein the predetermined resistance is established by a second memory element in the bit cell, maintained at a resistance state that is complementary with the resistance state of the memory element coupled to the bit line.

15. A sense circuit for an integrated circuit memory with bit cells in addressable memory words, each bit cell being accessed for a read operation via a bit line BL and having a reference bit line REFBL, the sense circuit comprising:

a settable latch with inverters cross coupled at nodes, the sense circuit having two level detectors each having an output coupled to one of the nodes, a sense input coupled to one of the bit line and the reference bit line, the level detectors being configured to switch when the respective sense input thereof crosses switching threshold, thereby driving an associated to one of the nodes to a set voltage;

switching transistors coupled to the inverters, the switching transistors enabling a first of the comparators to reach the switching threshold to set the latch.

16. The sense circuit of claim 15, wherein the sense circuit is enabled by precharge circuit coupled to establish a primed state of the latch of the sense circuit prior to addressing of the bit cell.

17. The sense circuit of claim 15, wherein the latch of the sense circuit comprises cross coupled inverters having complementary PMOS and NMOS transistors, and wherein a blocking transistor is coupled into each of the inverters and is nonconductive in a primed state wherein output nodes of the cross coupled inverters are maintained in a same logic state.

18. The sense circuit of claim 17, wherein the blocking transistor is coupled to switch on to conduct in response to a level detector sensing a bit line voltage below a threshold, thereby enabling operation of one of the inverters and establishing output voltages for the nodes.

19. The sense circuit of claim 15, wherein the inverters are coupled by switching transistors to complementary precharge signals; wherein the inverters are held with both nodes at high voltage when a precharge state is true; the inverters are enabled but not cross coupled when switching to precharge false and a word line signal is enabled; and the inverters latch into a cross coupled state when a first of the level detectors switches.

20. The sense circuit of claim 15, wherein each of the inverters has a PMOS shunt transistor coupled in parallel with the PMOS transistor of said inverter, a gate of the PMOS shunt transistor being coupled to the precharge signal for shunting the PMOS transistor of the inverter such during a priming state prior to assertion of a word line signal, the nodes of the cross coupled inverters are held in a same logic state.

* * * * *